(12) United States Patent
Liu (10) Patent No.: US 9,947,814 B2
(45) Date of Patent: Apr. 17, 2018

(54) SEMICONDUCTOR OPTICAL SENSOR

(71) Applicant: Artilux Inc., Hsinchu County (TW)

(72) Inventor: Han-Din Liu, Sunnyvale, CA (US)

(73) Assignee: ARTILUX INC., Hsinchu County (TW)

( * ) Notice: Subject to any disclaimer, the term of this patent is extended or adjusted under 35 U.S.C. 154(b) by 0 days.

(21) Appl. No.: 14/931,249

(22) Filed: Nov. 3, 2015

(65) Prior Publication Data

US 2016/0126371 A1    May 5, 2016

Related U.S. Application Data

(60) Provisional application No. 62/074,102, filed on Nov. 3, 2014.

(51) Int. Cl.
*H01L 31/0232* (2014.01)
*H01L 31/0203* (2014.01)
*H01L 27/146* (2006.01)

(52) U.S. Cl.
CPC .. *H01L 31/02327* (2013.01); *H01L 27/14625* (2013.01); *H01L 27/14627* (2013.01); *H01L 27/14629* (2013.01); *H01L 31/0203* (2013.01)

(58) Field of Classification Search
CPC ............. H01L 31/02327; H01L 31/028; H01L 31/101; H01L 27/14629
See application file for complete search history.

(56) References Cited

U.S. PATENT DOCUMENTS

| 8,207,590 | B2 * | 6/2012 | Park | H01L 27/14621 257/444 |
| 2006/0079017 | A1 * | 4/2006 | Taguchi | H01L 27/14627 438/60 |
| 2015/0204556 | A1 * | 7/2015 | Kusukame | F24F 11/0034 165/237 |
| 2016/0126381 | A1 * | 5/2016 | Wang | H01L 31/03522 257/429 |

\* cited by examiner

*Primary Examiner* — Moazzam Hossain
*Assistant Examiner* — Farun Lu
(74) *Attorney, Agent, or Firm* — Chun-Ming Shih; HDLS IPR Services (57) ABSTRACT

A semiconductor optical sensor includes a plurality of sensing units and to senses an incident optical signal to generate an electrical signal. One of the sensing units includes a substrate, an optical sensing element, a lens and an optical shielding element. The optical sensing element, whose material is different from that of the substrate, converts the incident optical signal into the electrical signal. The lens, whose material includes the same as that of the substrate, guides the incident optical signal to the optical sensing element by changing the propagation path of the incident optical signal. The optical shielding element, which surrounds the optical sensing element, alters the propagation path or propagation distance of the incident optical signal after the incident optical signal passes through the lens such that the incident optical signal will not reach an optical sensing element of an adjacent sensing unit.

12 Claims, 10 Drawing Sheets

SEMICONDUCTOR OPTICAL SENSOR

CROSS-REFERENCE TO RELATED APPLICATION

This patent application claims the benefit of U.S. Provisional Patent Application No. 62/074,102, filed Nov. 3, 2014, which is incorporated by reference herein.

BACKGROUND OF THE INVENTION

Field of the Invention

The present disclosure relates to a semiconductor optical sensor, especially to a semiconductor optical sensor with optical shielding element.

Description of Prior Art

The optical sensor system generally includes lens, photo sensitive element, metal routing. The incident optical signal is first focused by the lens and then converted into electric signal by the photo sensitive element. The converted electric signal is sent, through the metal routing, to other elements for further analyzing and processing. However, the performance of the optical sensor system may be degraded by the unabsorbed part of the incident optical signal after the incident optical signal passes through the photo sensitive element. In the optical sensor constituted by an array of photo sensitive elements, crosstalk among the photo sensitive elements caused by leaked optical signal (unabsorbed part of the incident optical signal) will influence the measurement result.

SUMMARY OF THE INVENTION

It is an object of the present disclosure to provide a semiconductor optical sensor with better light focusing and reduced optical crosstalk.

According to one aspect of the present disclosure, a semiconductor optical sensor includes a plurality of sensing units, the semiconductor optical sensor converting an incident optical signal into an electric signal and one of the sensing units comprising: a substrate; an optical sensing element using a different material with that of the substrate and converting the incident optical signal into the electric signal; a lens using a same material with that of the substrate and changing a propagation path of the incident optical signal to guide the incident optical signal to the optical sensing element; and an optical shielding element surrounding the optical sensing element and changing the propagation path of the incident optical signal or a propagation distance of the incident optical signal such that the incident optical signal does not further propagate to another sensing unit adjacent to the sensing unit impinged by the incident optical signal.

According to another aspect of the present disclosure, a semiconductor optical sensor converts an incident optical signal into an electric signal and comprises: a substrate; an optical sensing element using a different material with that of the substrate and converting the incident optical signal into the electric signal; a lens using a same material with that of the substrate and changing a propagation path of the incident optical signal to guide the incident optical signal to the optical sensing element; an optical confinement element arranged at a lateral side of the optical sensing element and coplanar with the optical sensing element, the optical confinement element absorbing or reflecting a portion of the incident optical signal after the incident optical signal passing the lens; and an optical reflection element arranged atop the optical sensing element and reflecting an unabsorbed component of the incident optical signal after the incident optical signal passing the optical sensing element.

The semiconductor optical sensor according to the present disclosure can prevent the unabsorbed incident optical signal from leaking to adjacent sensing units, thus reducing optical cross talk and dark current.

BRIEF DESCRIPTION OF DRAWING

The present disclosed example itself, however, may be best understood by reference to the following detailed description of the present disclosed example, which describes an exemplary embodiment of the present disclosed example, taken in conjunction with the accompanying drawings, in which.

DETAILED DESCRIPTION OF THE INVENTION

The present disclosure will be described in greater detail by referring to the following discussion and drawings that accompany the present disclosure. It is noted that the drawings of the present disclosure are provided for illustrative purposes and, as such, they are not drawn to scale. In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

Figure 1A:
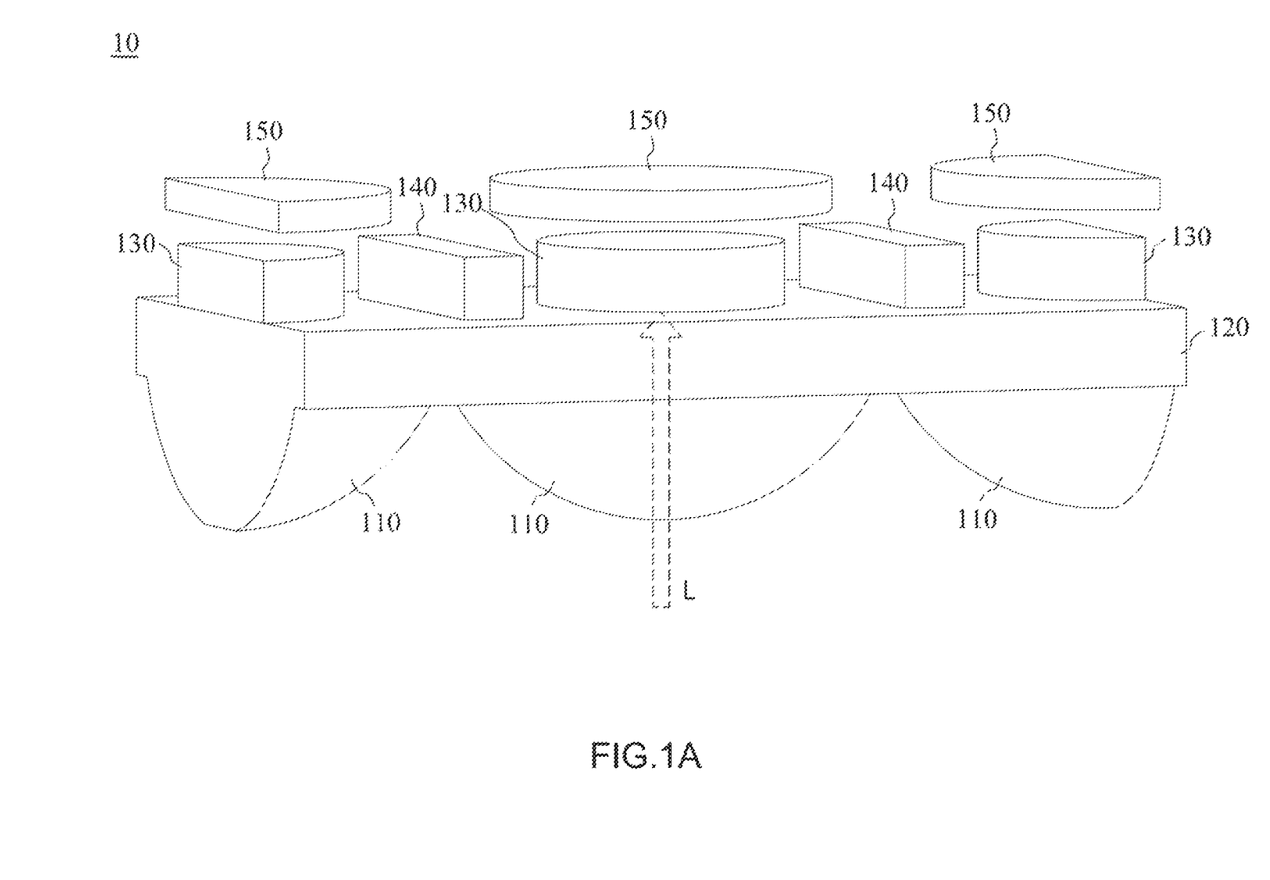
FIG. 1A shows a perspective view of the semiconductor optical sensor according to the present disclosure.
Figure 1B:
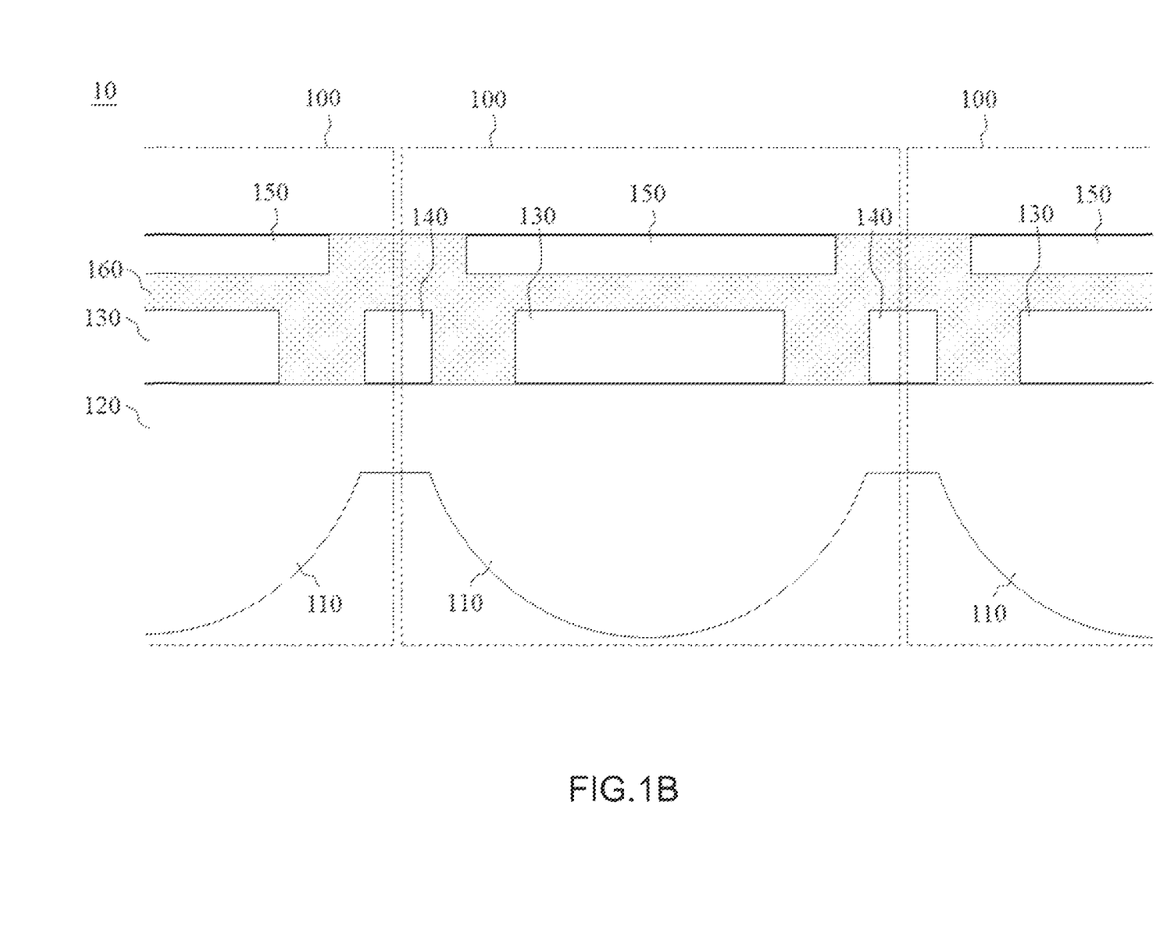
FIG. 1B is a sectional view of the semiconductor optical sensor shown in FIG. 1A.

FIG. 1A shows a perspective view of the semiconductor optical sensor according to the present disclosure, and FIG. 1B is a sectional view of the semiconductor optical sensor shown in FIG. 1A. The semiconductor optical sensor 10 comprises a plurality of sensing units 100 and the plurality of sensing units 100 can be arranged in an array. FIGS. 1A and 1B only depict the partial structures (or the complete structures) of three adjacent sensing units 100 along one row of the sensor array. The semiconductor optical sensor 10 comprises a substrate 120, a plurality of hemispheric lens 110, which is a refractive element, arranged on a lower face of the substrate 120. The lens 110 can be fabricated with the same material as that of the substrate 120. The material of the substrate can be, but not limited to, silicon (Si), silicon on insulator, (SOI), InP, or SiC. The lens 110 can be fabricated on the substrate 120 by semiconductor manufacture process such as, but not limited to, etching, imprinting, or pattern transferring. The lens 110 can be fabricated with lower cost because they are fabricated from the same material as the substrate 120 and with semiconductor manufacture process. The alignment between the substrate 120 and the lens 110 can be achieved by the standard photolithography in semiconductor manufacture process and becomes simpler and more precise. In some embodiments of the present disclosure, the lens 110 can be fabricated with material different from that of the substrate 120. The semiconductor optical sensor 10 further comprises a plurality of optical sensing elements 130 on an upper face of the substrate 120. The incident optical signal as indicated by the arrow shown in FIG. 1A is from the bottom of this depiction, getting focused on the optical sensing elements 130 by the lens 110 and then converted into electric signal by the optical sensing elements 130.

The semiconductor optical sensor 10 further comprises a plurality of optical confinement elements 140; each of the optical confinement elements 140 is arranged between adjacent optical sensing elements 130. The optical confinement element 140 is such constructed to prevent the unabsorbed component of an optical signal, which impinged to an optical sensing element 130, from propagating to adjacent optical sensing elements 130. In the shown embodiment, the adjacent optical sensing elements 130 share one optical confinement elements 140 place therebetween. The optical confinement elements 140 and the optical sensing elements 130 are fabricated on the upper face of the substrate 120. The optical confinement elements 140 can be fabricated with the same material as that of the optical sensing element 130 such that the optical confinement elements 140 can absorb the unabsorbed component (leaked components) of the optical signal impinged to the sensing unit 100 to trap the incident optical signal within the sensor unit 100 surrounded by the optical confinement elements 140, thus reducing optical crosstalk. In one embodiment shown in FIG. 1B, the optical confinement element 140 has the same height as that of the optical sensing element 130 such that the optical confinement element 140 and the optical sensing element 130 can be made with the same semiconductor manufacture steps (for example, the same deposition step followed by respective lithography patterns). In other embodiments, the optical confinement element 140 can be higher than or lower than the optical sensing element 130 to achieve different optical confinement effects.

Each of the sensing units 100 further comprises an optical reflection element 150 arranged atop the optical sensing element 130, namely, opposite to the lens 110. More particularly, the optical reflection element 150 is atop the dielectric layer 160 (the dielectric layer 160 is omitted in FIG. 1A to more clearly show the relative positions of other elements). The dielectric layer 160 can adopt well-known dielectric material, such as silicon oxide ($SiO_2$), in semiconductor manufacture process. The optical reflection element 150 allows unabsorbed components of the incident optical signal passing through the optical sensing element 130 to be reflected back toward the optical sensing element 130 (namely, changing the propagation direction of the unabsorbed components of the incident optical signal to allow the unabsorbed components to be absorbed again) for increasing optical-electrical conversion efficiency for the optical sensing element 130. The thickness of the dielectric layer 160 can be adjusted according to the wavelength of the incident optical signal, the dielectric constant of the dielectric layer 160 and the material of the optical reflection element 150 to achieve optimal reflection. In one embodiment of the present disclosure, the optical reflection element 150 may be made out of conductive material, dielectric, semiconductor or their combinations. When conductive material is selected as the material for the optical reflection element 150, the optical reflection element 150 can be electrically connected to the optical sensing element 130 through conductive wires (not shown) such that the optical reflection element 150 can serve as both the optical reflector and the electrical contact for connecting with other electrical devices such as capacitor, resistor, inductor and transistor. The other electrical devices can be fabricated on the surface of the substrate 120 or within the substrate 120.

Figure 2:
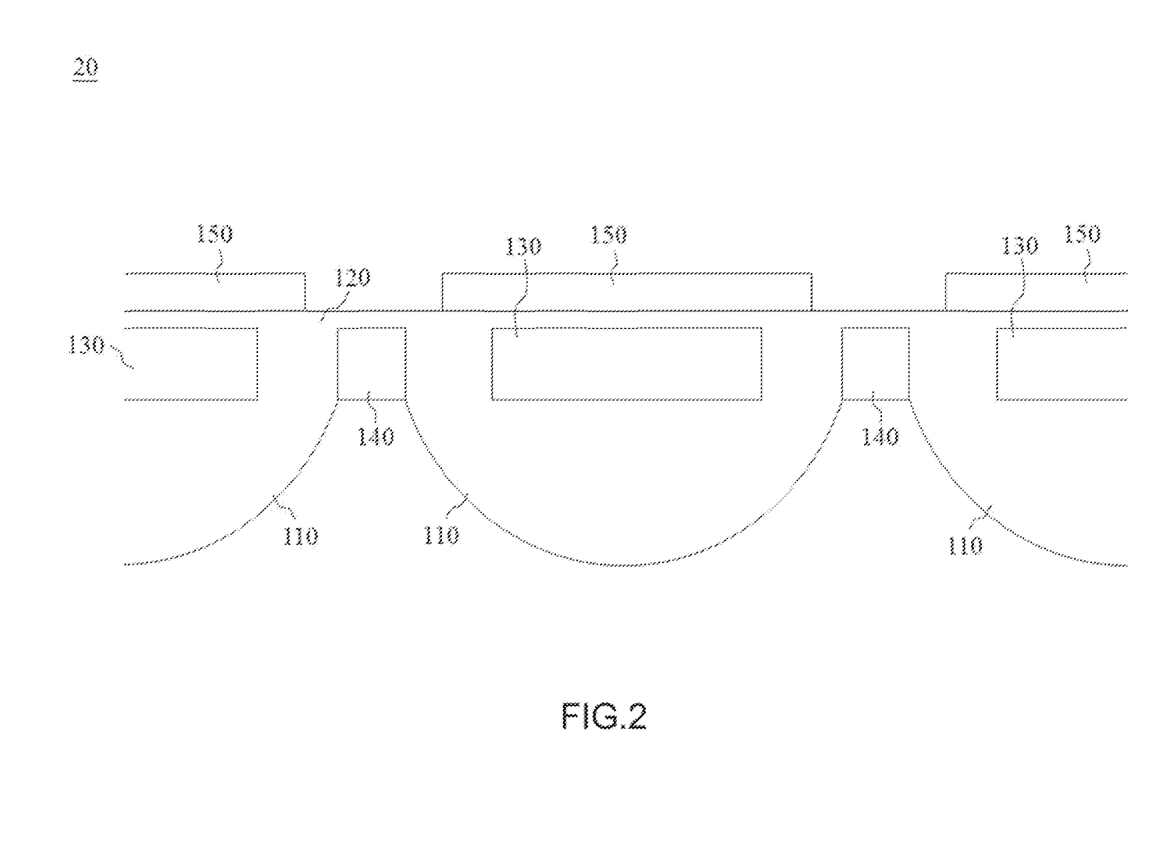
FIG. 2 shows a sectional view of the semiconductor optical sensor according to another embodiment of the present disclosure.

As shown in FIG. 2, the optical sensing element 130 and the optical confinement element 140 can be fabricated within (embedded within) the substrate 120, while the optical reflection element 150 can be directly fabricated on the upper face of the substrate 120. The lens 110 is arranged on the lower face of the substrate 120 and can be integrally formed with the substrate 120 as well as can have the same material as that of the substrate 120. In the shown embodiment, the heights of the optical sensing element 130 and the optical confinement element 140 are smaller than the thickness of the substrate 120. In other embodiments, the heights of the optical sensing element 130 and the optical confinement element 140 can be equal to the thickness of the substrate 120, namely the optical sensing element 130 is exposed out of the upper face of the substrate 120 and in direct contact with the optical reflection element 150 to prevent the incident optical signal from leaking. The optical reflection element 150 can be made out of conductive material to achieve the electric connection between the optical sensing element 130 and the optical reflection element 150 as well.

Figure 3A:
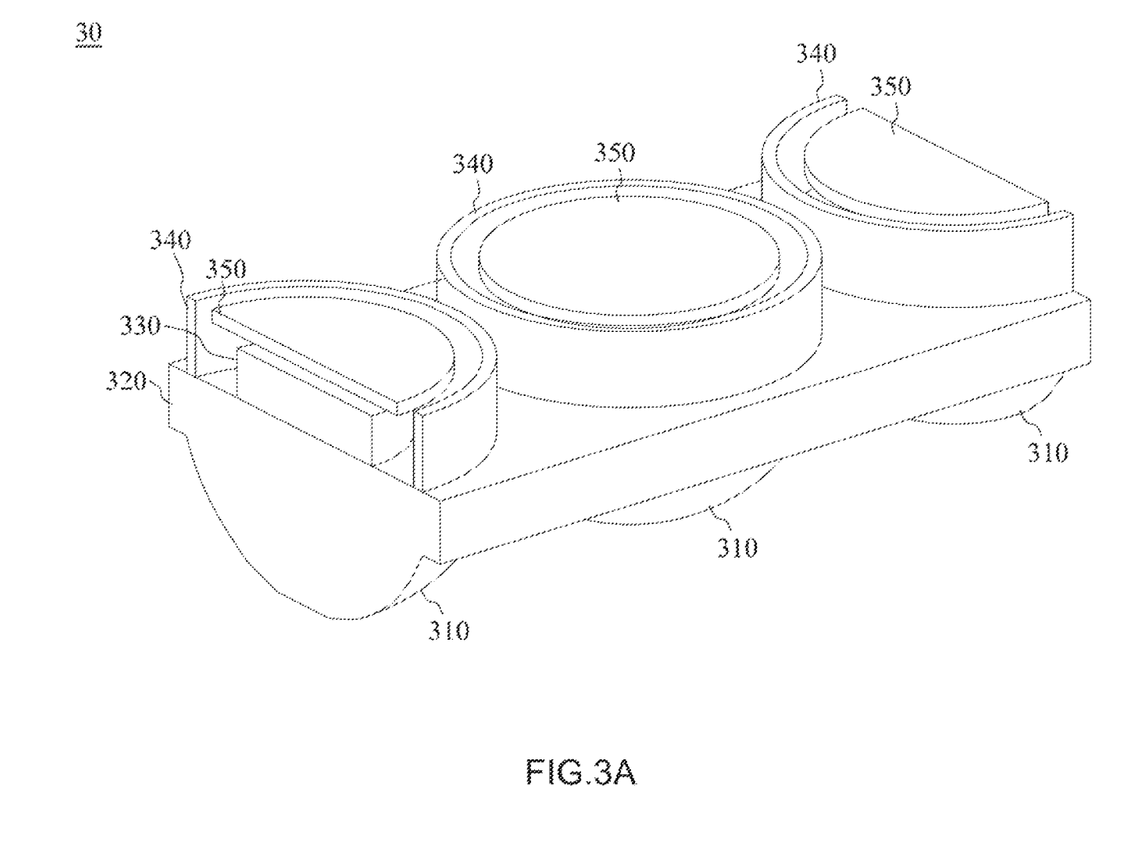
FIG. 3A shows a perspective view of the semiconductor optical sensor according to still another embodiment of the present disclosure.
Figure 3B:
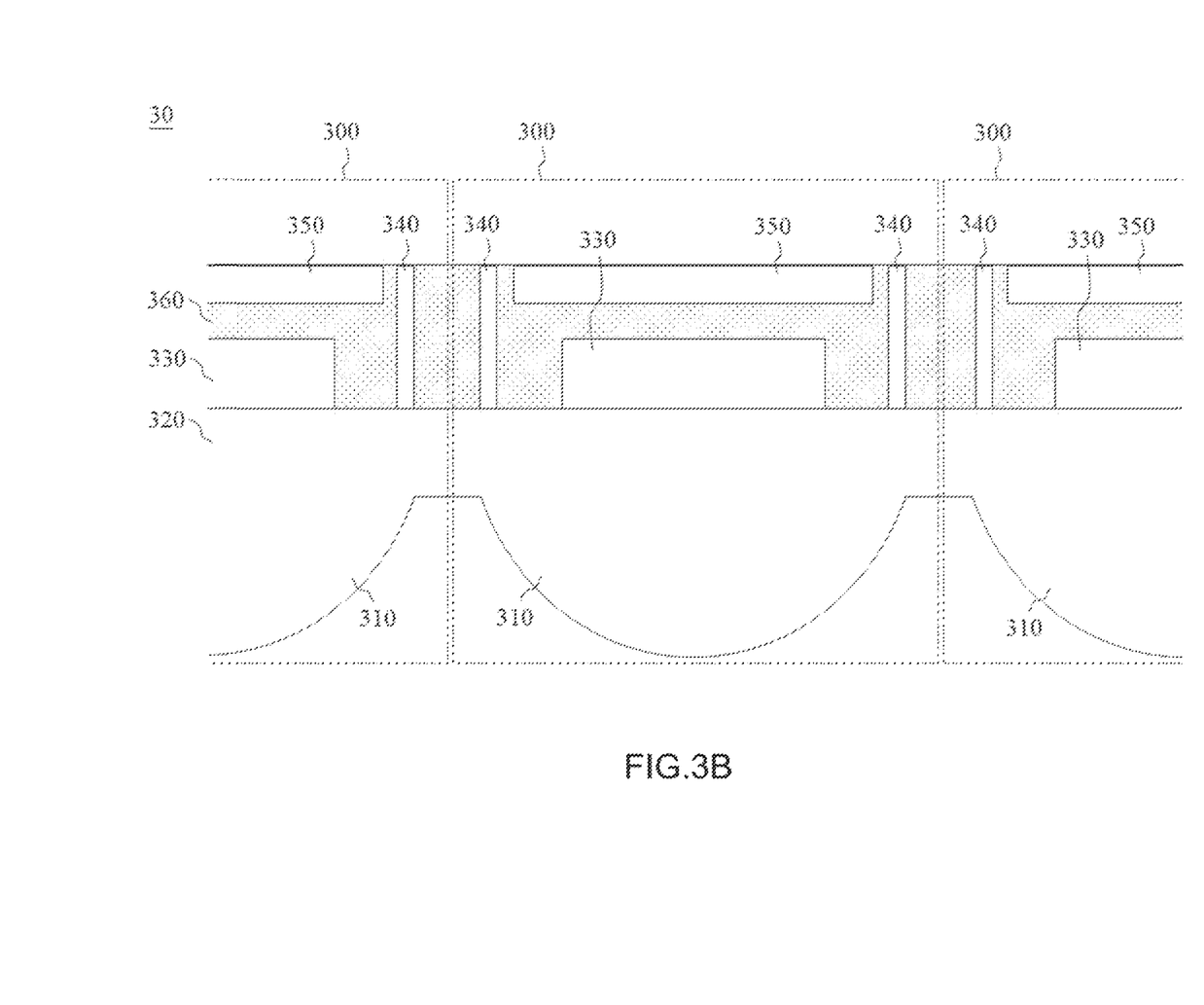
FIG. 3B is a sectional view of the semiconductor optical sensor shown in FIG. 3A.

FIG. 3A shows a perspective view of the semiconductor optical sensor according to another embodiment of the present disclosure, and FIG. 3B is a sectional view of the semiconductor optical sensor shown in FIG. 3A. The semiconductor optical sensor 30 comprises a plurality of sensing units 300 and the plurality of sensing units 300 can be arranged in an array. FIGS. 3A and 3B only depict the partial structures (or the complete structures) of three adjacent sensing units 300 along one row of the array. The semiconductor optical sensor 30 comprises a substrate 320, a plurality of hemispheric lens 310 arranged on a lower face of the substrate 320. The lens 310 can be fabricated with the same material as that of the substrate 320, or material different with that of the substrate 320. The semiconductor optical sensor 30 further comprises a plurality of optical sensing elements 330 on an upper face of the substrate 320. The incident optical signal is focused on the optical sensing elements 330 by the lens 330 and then converted into electric signal by the optical sensing elements 330.

The semiconductor optical sensor 30 further comprises a plurality of optical confinement elements 340 to separate adjacent optical sensing elements 330. In the shown embodiment, the optical confinement element 340 surrounds the optical sensing element 330 to prevent the optical signal incident to the optical sensing element 330 from leaking. Each of the optical confinement elements 340 is exclusive for one sensing unit 300, namely, the adjacent sensing units 300 do not share a common optical confinement element 340. In above mentioned semiconductor optical sensors 10 and 20, the adjacent of sensor units 300 share one optical confinement element 140. The optical confinement elements 340 can be fabricated with the same material as that of the optical sensing element 330, or can be fabricated with material different from that of the optical sensing element 330. In one embodiment, the optical confinement element 340 is made out of conductive material to confine optical signal within the sensing unit 300 by light reflection. When the optical confinement element 340 is made of conductive material, the optical confinement element 340 also serves as electric contact for the sensing unit 300 to electrically connect the sensing unit 300 with external circuit. The optical sensing element 330 can be electrically connected to the optical confinement element 340 through metal routing or through doped area on the substrate and between the optical sensing element 330 and the optical confinement element 340.

Each of the sensing units 300 further comprises an optical reflection element 350 arranged atop the optical sensing element 330, namely, opposite to the lens 310. More particularly, the optical reflection element 350 is atop the dielectric layer 360 (the dielectric layer 160 is omitted in FIG. 3A to more clearly show the relative positions of other elements). The dielectric layer 360 can adopt well-known dielectric material in semiconductor process such as silicon oxide (SiO2). The optical reflection element 350 allows unabsorbed components of the incident optical signal passing through the optical sensing element 330 to be reflected back toward the optical sensing element 330 (namely, changing the propagation direction of the unabsorbed components of the incident optical signal to allow the unabsorbed components to be absorbed again) for increasing optical-electrical conversion efficiency for the optical sensing element 330. The thickness of the dielectric layer 360 can be adjusted according to the wavelength of the incident optical signal, the dielectric constant of the dielectric layer 360 and the material of the optical reflection element 350 to achieve optimal reflection. In one embodiment of the present disclosure, the optical reflection element 350 may be made out of conductive material, dielectric, semiconductor or their combinations. When conductive material is selected as the material for the optical reflection element 350, the optical reflection element 350 can be electrically connected to the optical sensing element 330 through conductive wires (not shown) such that the optical reflection element 350 can serve as both the optical reflector and the electrical contact for connecting with other electrical. The optical confinement elements 340 and the optical reflection element 350 can be fabricated in the same step or different steps of semiconductor manufacture process.

Figure 4:
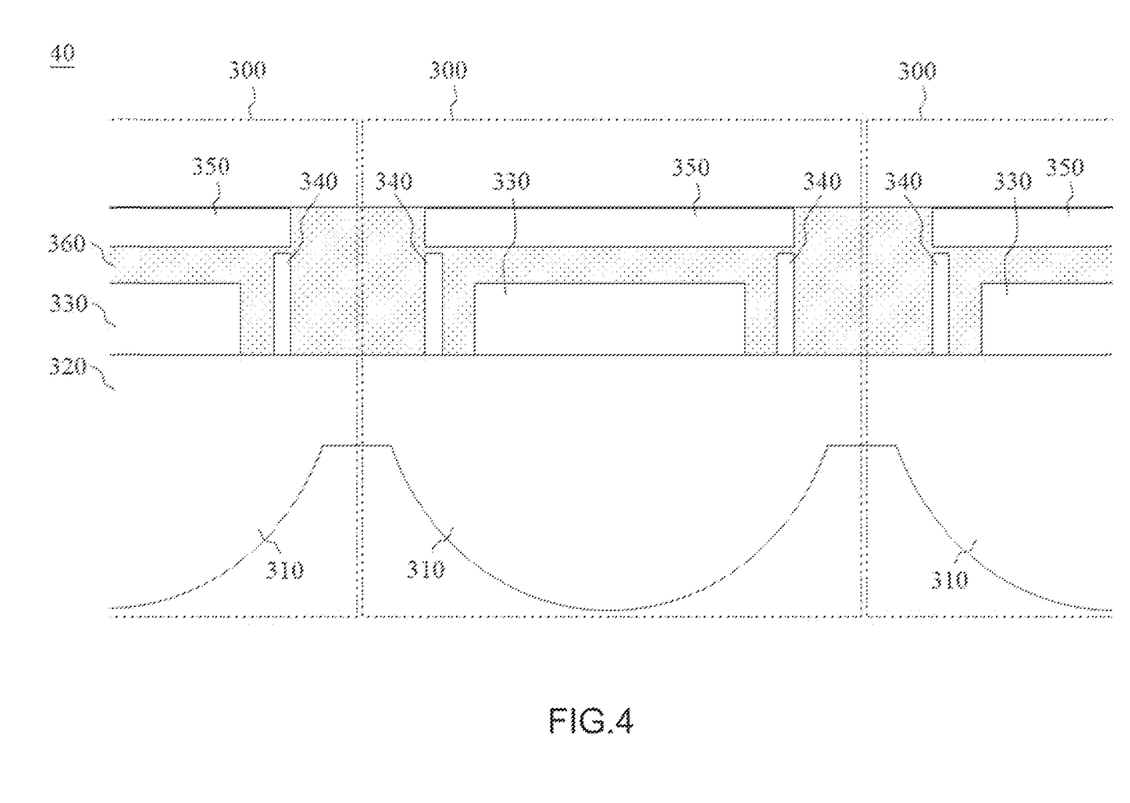
FIG. 4 shows a sectional view of the semiconductor optical sensor according to still another embodiment of the present disclosure.
Figure 5:
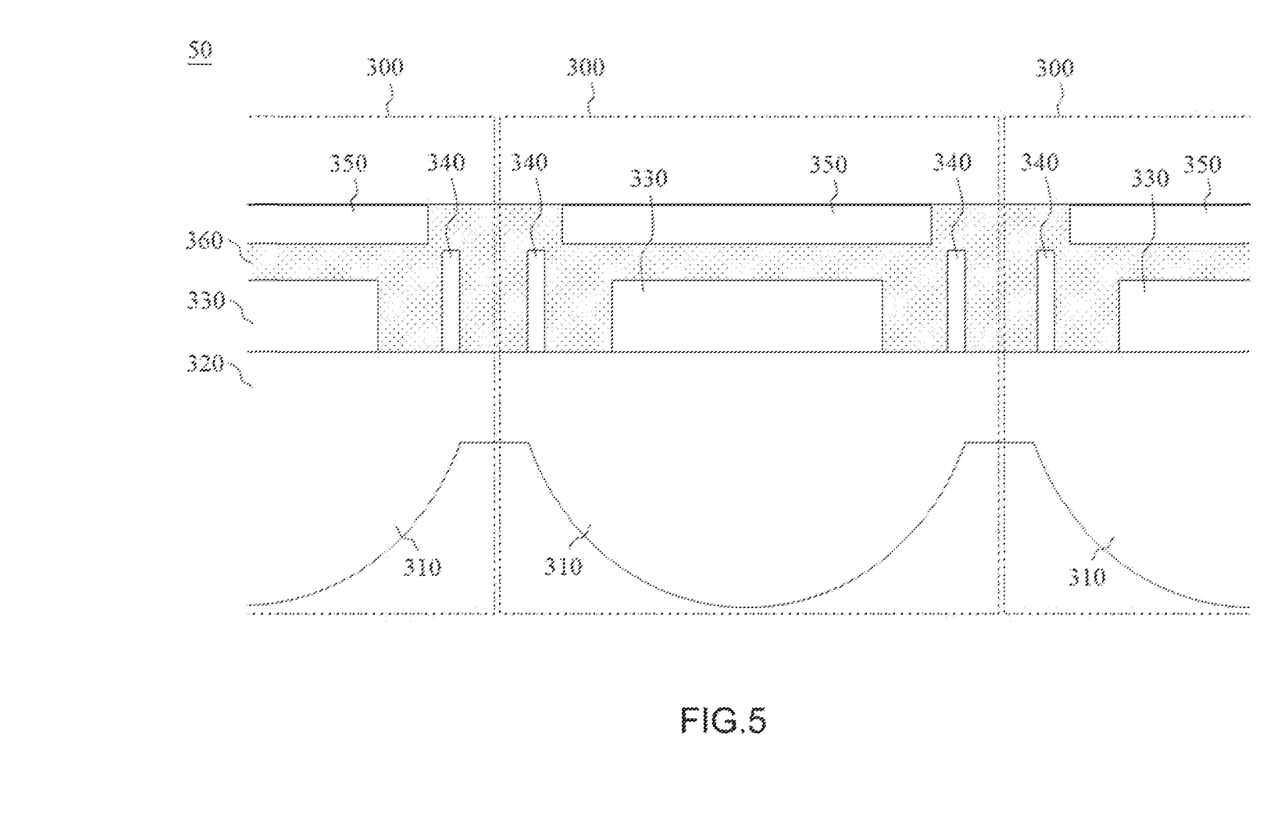
FIG. 5 shows a sectional view of the semiconductor optical sensor according to still another embodiment of the present disclosure.

In this embodiment, the height of the optical confinement elements 340 is larger than or equal to the sum of the thicknesses of the optical sensing element 330 and the optical reflection element 350. Namely, for an imaginary plane on the top face of the optical confinement elements 340 and parallel with the top face of the substrate 320, the optical sensing element 330 and the optical reflection element 350 are covered by the imaginary plane. In other embodiments, as the semiconductor optical sensor 40 shown in FIG. 4, the optical reflection element 350 covers both the optical sensing element 330 and the optical confinement element 340. In other embodiments, as the semiconductor optical sensor 50 shown in FIG. 5, the optical reflection element 350 does not cover the optical confinement element 340, and the optical confinement element 340 is not high enough to enclose the optical reflection element 350.

In other embodiments, the semiconductor optical sensors 10, 30, 40, or 50, and the optical reflection element 150 (or the optical reflection element 350) can be directly fabricated on the upper face of the optical sensing element 130 (or the optical sensing element 330) as long as material and process permit. Namely, the optical reflection element 150 (or the optical reflection element 350) is in direct contact with the optical sensing element 130 (or the optical sensing element 330) and no dielectric layer 160 (or dielectric layer 360) is present. In the semiconductor optical sensor 40, the optical reflection element 350 can be in direct contact with both the optical sensing element 330 and the optical confinement element 340. Similar to the optical sensor 20 shown in FIG. 2, the optical sensing element 330 and the optical confinement element 340 of the semiconductor optical sensors 10, 30, 40, or 50

In the embodiments shown in FIGS. 1 to 5, the optical sensing element 130 (or the optical sensing element 330) and the optical confinement element 140 (or the optical confinement element 340) are substantially arranged on the same plane to provide good optical confinement.

Figure 6A:
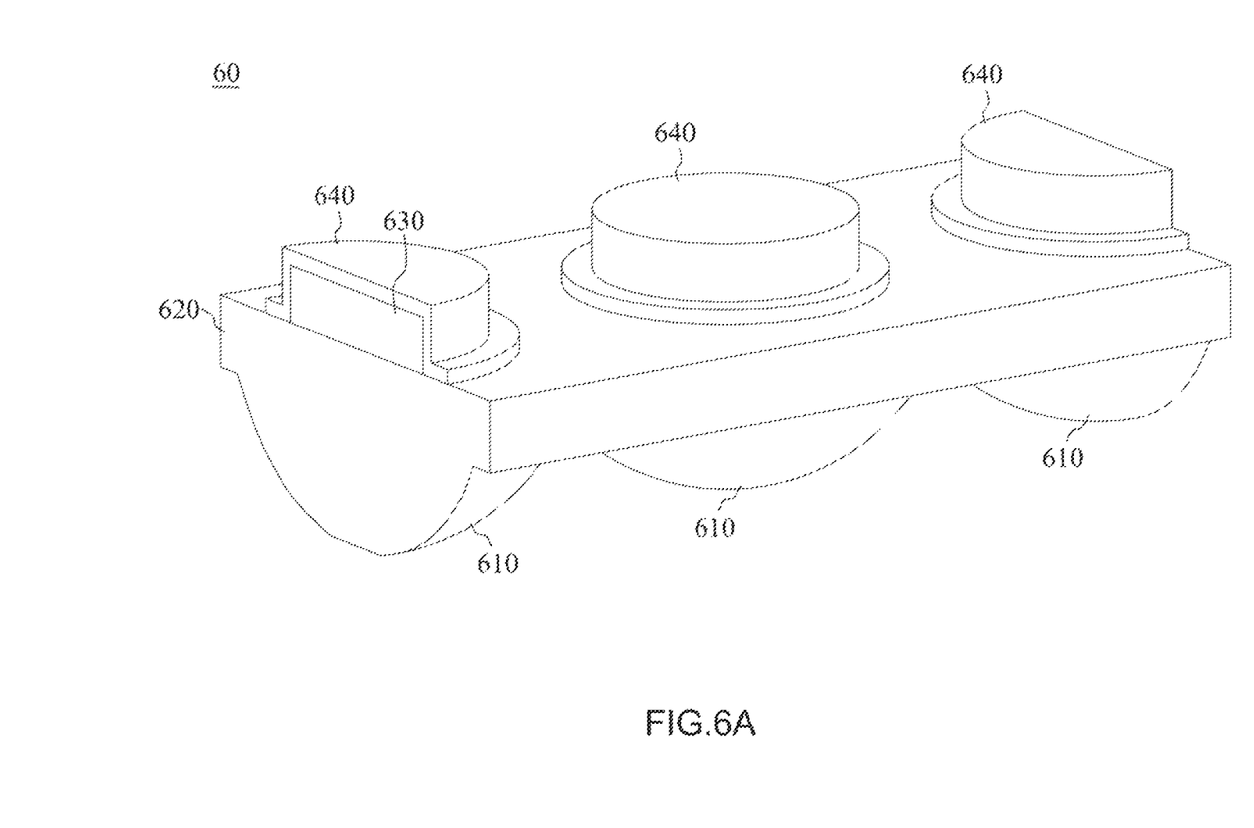
FIG. 6A shows a perspective view of the semiconductor optical sensor according to still another embodiment of the present disclosure.
Figure 6B:
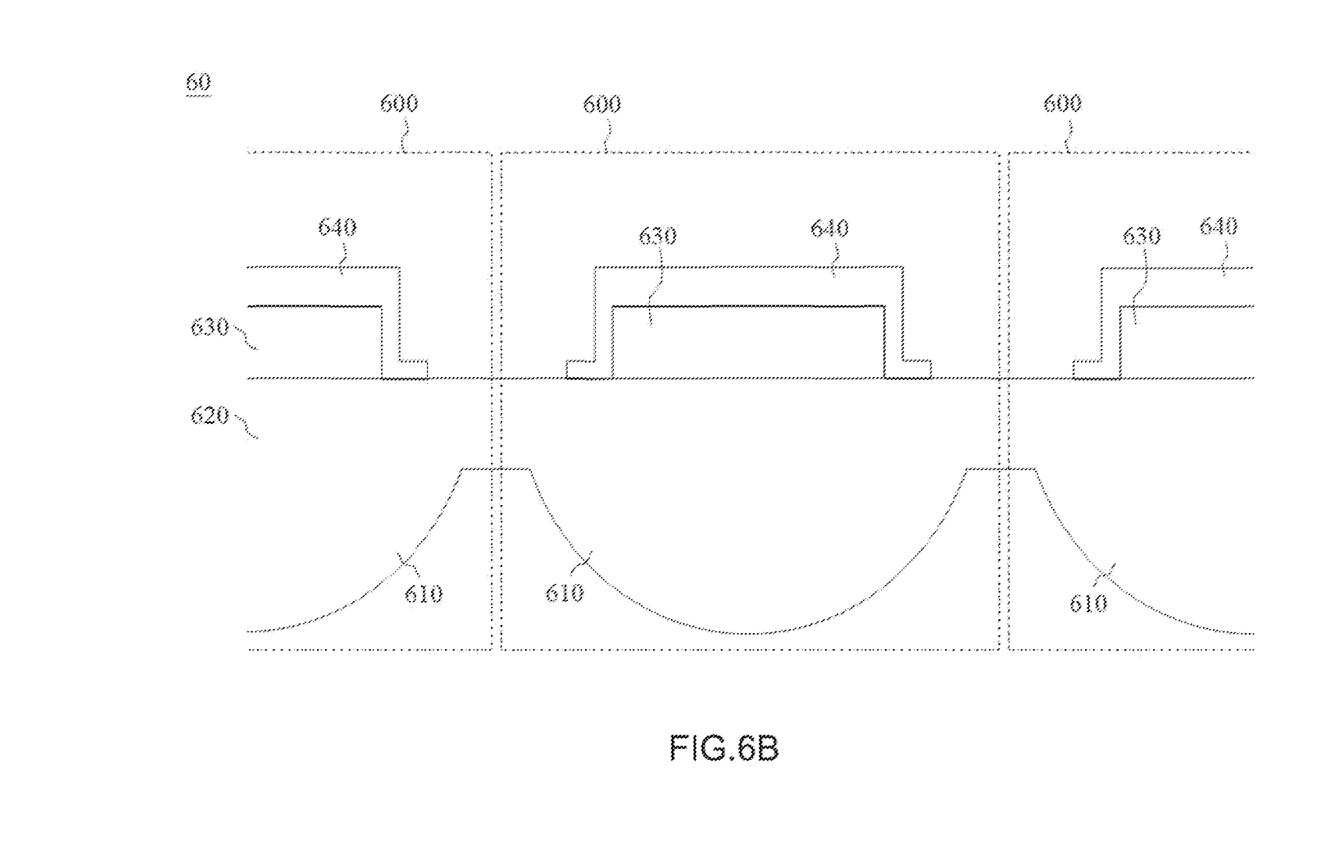
FIG. 6B is a sectional view of the semiconductor optical sensor shown in FIG. 6A.

FIG. 6A shows a perspective view of the semiconductor optical sensor according to another embodiment of the present disclosure, and FIG. 6B is a sectional view of the semiconductor optical sensor shown in FIG. 6A. The semiconductor optical sensor 60 comprises a plurality of sensing units 600 and the plurality of sensing units 600 can be arranged in an array. FIGS. 6A and 6B only depict the partial structures (or the complete structures) of three adjacent sensing units 600 along one row of the array. The semiconductor optical sensor 60 comprises a substrate 620, and a plurality of hemispheric lens 610 arranged on a lower face of the substrate 620. The lens 610 can be fabricated with the same material as that of the substrate 620, or material different with that of the substrate 320. The semiconductor optical sensor 30 further comprises a plurality of optical sensing elements 630 on an upper face of the substrate 620. The incident optical signal is focused on the optical sensing elements 360 by the lens 630 and then converted into electric signal by the optical sensing elements 630.

The semiconductor optical sensor 60 further comprises a plurality of optical shielding elements 640 to prevent crosstalk among the sensing units 600. The optical shielding element 640 encapsulates a plurality of sides of the optical sensing element 630 except the side of the optical sensing element 630, which is in contact with the substrate 620. The encapsulating way of the optical shielding element 640 can be such that the optical shielding element 640 is in full contact with the upper side and lateral sides of the optical sensing element 630 as shown in FIGS. 6A and 6B. Alternatively, the optical shielding element 640 can be in partial contact or separated with the upper side and lateral sides of the optical sensing element 630. The optical shielding element 640 confines light propagation from the upper side and lateral sides of the optical sensing element 630. Namely the optical shielding element 640 substantially achieve the function of the optical confinement element 140 (or the optical confinement element 340) in combination with the optical reflection element 150 (or the optical reflection element 350). The optical shielding element 640 reflects or absorbs the unabsorbed components of the incident optical signal, which passes through the optical sensing element 630 and emits from the upper side and lateral sides of the optical sensing element 630, to prevent the unabsorbed components from leaking. Each of the sensing units 600 has exclusive optical shielding element 640, namely, two adjacent sensing units 600 do not share a common optical shielding element 640. The optical shielding element 640 can be made out of conductive material, dielectric, semiconductor or their combinations. In one embodiment, the optical shielding element 640 is made out of conductive material to confine optical signal within the sensing unit 600 by light reflection. When the optical shielding element 640 is made out of conductive material, the optical shielding element 640 also serves as electric contact for the sensing unit 600 to electrically connect the sensing unit 300 with external circuit. Similarly, the optical sensing element 630 and the optical shielding element 640 can be completely or partially formed within (embedded within) the substrate 620.

The shapes of the above mentioned lens 110, 310, 610 are not limited to spherical or hemispheric and can be any shape (such as aspheric shape) or structure (such as photonic crystal) capable of providing optical perturbation. Purposes for optical perturbation may be, but not limited to, reflecting, transmitting, focusing, collimating or diffracting the incident optical signal. The surface of the lens can be additional treated to enhance the ability for optical perturbation. Moreover, the structure of the optical confinement element 340 and the optical shielding element 640 is not limited to circular and can be elliptical or rectangular etc.

The optical confinement element 140 and the optical reflection element 150 of the semiconductor optical sensors 10 can constitute an optical shielding element encapsulating the optical sensing element 130. Similarly, the optical confinement element 340 and the optical reflection element 350 of the semiconductor optical sensors 30 can constitute an optical shielding element encapsulating the optical sensing element 330. The optical shielding element constituted by the optical confinement element 140 and the optical reflection element 150 also confines the incident optical signal passing the lens 110 and/or the optical sensing element 130 and prevents the unabsorbed components of the incident optical signal from leaking to the adjacent sensing unit 100, thus reducing optical crosstalk.

The criterions of selecting material for the substrate and the optical sensing element (such as the substrate 120 and the optical sensing element 130, the substrate 320 and the optical sensing element 330, and the substrate 620 and the optical sensing element 630) depend on optical signal to be sensed by the semiconductor optical sensor. For example, the refractive index of the substrate should be compatible with the wavelength of the optical signal and the material of the substrate should be compatible with the material of the optical sensing element. In one embodiment, the bandgap of the substrate should be larger than the bandgap of the optical sensing element. For example, the substrate is primarily made out of silicon (Si) and the optical sensing element is primarily made out of germanium (Ge). The semiconductor optical sensors use this kind of material combination can be used to sense optical signal in near infrared region (0.75~1.4 um). In other embodiments, the optical sensing element is made out of a material with different physical characteristics from that of the substrate material. Difference in physical characteristics may be induced by, but not limited to chemical element composition, material bandgap modification, extrinsic doping, defect introduction, and etc.

Figure 7:
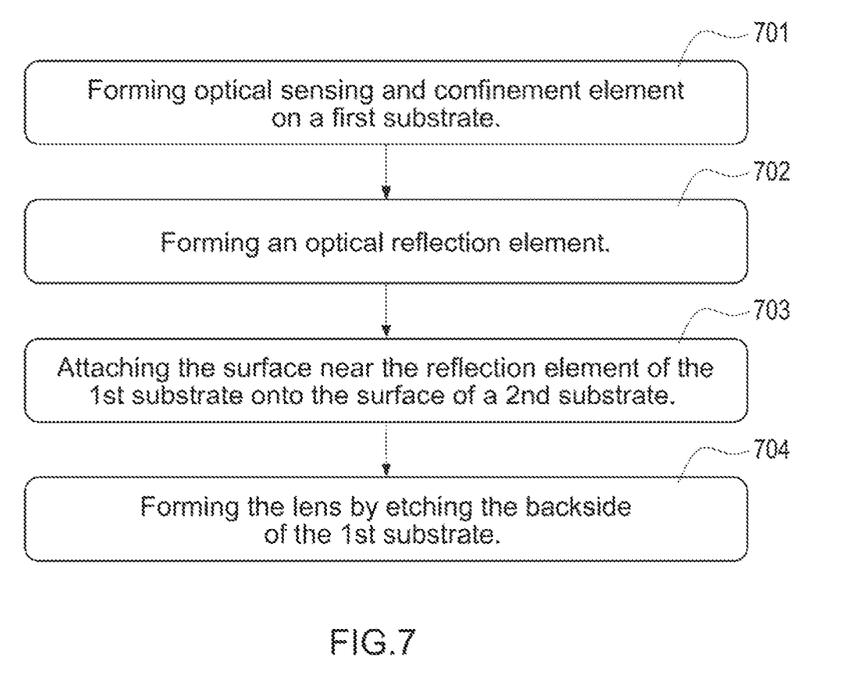
FIG. 7 shows the exemplary process flow for manufacturing the semiconductor optical sensor of the present disclosure.

The exemplary process flow can be described as following. First the optical sensing element and the optical confinement element are formed (step 701). In some implementations, the optical sensing element is formed by selectively growing Germanium based absorption material within an area on top of the substrate, or by blanket epitaxial growth of Germanium based absorption material on top of the substrate. The optical confinement can be formed during the same steps of forming the absorption material by intentionally leaving the some of the absorption material surrounding the optical sensor element. In some implementations, the optical confinement can be formed either before or after the formation of optical sensing element by depositing a reflective or absorptive material. In some implementations, after forming the Germanium based absorption material, a dielectric or semiconductor can be deposited enclosing the optical sensing element, and followed by depositing either an absorptive material such as Germanium or reflective material such as Aluminum. After forming the optical sensing and confinement element, the optical reflection material can be formed by depositing a reflective material atop the optical sensing element (step 702). Then, this structure is bonded to another host substrate by attaching the top surface near the optical reflection element onto the surface of the host substrate (step 703). The host substrate can include multiple metal routing or CMOS devices for further signal processing. The bonding can be done by metal to metal bonding, oxide to oxide bonding or other mechanisms. After the wafer bonding process, the optical device is flipped, and a large portion of the original substrate is removed and shaped into a curved structure as the lens structure by using methods such as a grey scale mask or nanoimprinting (step 704). In some implementations, the lens can be formed by deposition or attachment after a large portion of the original substrate is removed.

The foregoing descriptions of embodiments of the disclosed example have been presented only for purposes of illustration and description. They are not intended to be exhaustive or to limit the disclosed example to the forms disclosed. Accordingly, many modifications and variations will be apparent to practitioners skilled in the art. Additionally, the above disclosure is not intended to limit the disclosed example. The scope of the disclosed example is defined by the appended.

What is claimed is:

1. A semiconductor optical sensor converting an incident optical signal into an electric signal and comprising:
   a substrate;
   an optical sensing element using a different material with that of the substrate and converting the incident optical signal into the electric signal;
   a refractive element including a same material with that of the substrate and changing a propagation path of the incident optical signal to guide the incident optical signal to the optical sensing element;
   an optical confinement element arranged at a lateral side of the optical sensing element and coplanar with the optical sensing element, the optical confinement element absorbing or reflecting a portion of the incident optical signal after the incident optical signal passing the refractive element; and
   an optical reflection element arranged atop the optical sensing element and reflecting an unabsorbed component of the incident optical signal after the incident optical signal passing the optical sensing element,
   wherein the optical sensing element is arranged on a face of the substrate and opposite to the refractive element, the optical confinement element is arranged on the face of the substrate, and light is incident through the refractive element into the optical sensing element;

wherein the optical reflection element covers on the respective optical sensing element, and an end surface of the optical confinement element is coplanar with a surface of the optical sensing element.

2. The semiconductor optical sensor in claim 1, wherein the optical confinement element is made out of a same material as that of the optical sensing element.

3. The semiconductor optical sensor in claim 2, wherein the optical confinement and the optical sensing element are fabricated by the same semiconductor processing step and have substantially the same thickness.

4. The semiconductor optical sensor in claim 1, wherein the optical confinement element is made out of conductive material.

5. The semiconductor optical sensor in claim 1, wherein the optical reflection element is made out of conductive material.

6. The semiconductor optical sensor in claim 1, wherein the optical sensing element is embedded within the substrate.

7. The semiconductor optical sensor in claim 1, wherein a bandgap of the material of the substrate is larger than the bandgap of the material of the optical sensing element.

8. The semiconductor optical sensor in claim 6, wherein the material of the substrate is silicon and the material of the optical sensing element includes germanium.

9. The semiconductor optical sensor in claim 4, wherein the optical confinement element is electrically connected to the optical sensing element to serve as electric contact for the sensing unit.

10. The semiconductor optical sensor in claim 5, wherein the optical reflection element is electrically connected to the optical sensing element to serve as electric contact for the sensing unit.

11. The semiconductor optical sensor in claim 6, wherein at least a portion of the optical confinement element is embedded within the substrate.

12. The semiconductor optical sensor in claim 1, wherein the optical reflection element has an area larger than an area of the corresponding optical sensing element.

\* \* \* \* \*